United States Patent
Fujii et al.

(10) Patent No.: US 11,373,832 B2
(45) Date of Patent: Jun. 28, 2022

(54) ELECTRIC-POWER CONVERSION APPARATUS

(71) Applicant: Mitsubishi Electric Corporation, Tokyo (JP)

(72) Inventors: Kenta Fujii, Tokyo (JP); Yuji Shirakata, Tokyo (JP); Masahiro Ueno, Tokyo (JP); Tomoaki Shimano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/634,212

(22) PCT Filed: Aug. 30, 2017

(86) PCT No.: PCT/JP2017/031058
§ 371 (c)(1),
(2) Date: Jan. 27, 2020

(87) PCT Pub. No.: WO2019/043807
PCT Pub. Date: Mar. 7, 2019

(65) Prior Publication Data
US 2020/0211802 A1    Jul. 2, 2020

(51) Int. Cl.
*H01H 85/02*    (2006.01)
*H01H 85/08*    (2006.01)
(Continued)

(52) U.S. Cl.
CPC ........ *H01H 85/0241* (2013.01); *H01H 85/08* (2013.01); *H01H 85/175* (2013.01); *H01H 85/38* (2013.01)

(58) Field of Classification Search
CPC .. H01H 85/0241; H01H 85/08; H01H 85/175; H01H 85/38; H01H 85/0082
See application file for complete search history.

(56) References Cited

U.S. PATENT DOCUMENTS

| | | | |
|---|---|---|---|
| 4,943,842 A | 7/1990 | Sugita et al. | |
| 5,068,706 A * | 11/1991 | Sugita | H01L 23/62 257/665 |
| 2008/0164969 A1 * | 7/2008 | Kono | H01L 23/5256 337/416 |

FOREIGN PATENT DOCUMENTS

| | | |
|---|---|---|
| JP | 63-221657 A | 9/1988 |
| JP | 07-078933 A | 3/1995 |

(Continued)

OTHER PUBLICATIONS

Communication dated Jun. 30, 2020 from Japanese Patent Office in JP Application No. 2019-538806.

(Continued)

*Primary Examiner* — Adolf D Berhane
*Assistant Examiner* — Afework S Demisse
(74) *Attorney, Agent, or Firm* — Sughrue Mion, PLLC; Richard C. Turner

(57) ABSTRACT

There is provided an electric-power conversion apparatus in which smoke emission, a burnout, and short-circuiting between a melted material and a peripheral member can be suppressed even when a fuse portion is melted by an excessive current. An electric-power conversion apparatus includes an electric power semiconductor device, an electrode wiring member, a case, a fuse portion formed in the electrode wiring member, a fuse resin member disposed between the fuse portion and the case, and a sealing resin member that seals the electric power semiconductor device, the electrode wiring member, the fuse portion, and the fuse resin member in the case.

10 Claims, 5 Drawing Sheets

(51) Int. Cl.
  *H01H 85/175*   (2006.01)
  *H01H 85/38*    (2006.01)

(56) References Cited

FOREIGN PATENT DOCUMENTS

| JP | 11-111153 A   | 4/1999  |
|----|---------------|---------|
| JP | 2003-068967 A | 3/2003  |
| JP | 2005-175439 A | 6/2005  |
| JP | 2008-235502 A | 10/2008 |
| JP | 2015-35338 A  | 2/2015  |

OTHER PUBLICATIONS

International Search Report for PCT/JP2017/031058 dated Dec. 5, 2017 [PCT/ISA/210].
Communication dated Nov. 25, 2020, issued by the Intellectual Property Office of India in application No. 201927052374.
Communication dated Jun. 3, 2021, from the China National Intellectual Property Administration in application No. 201780094088.X.
Communication dated Feb. 18, 2022 from The State Intellectual Property Office of People's Republic Machine of China in Application No. 201780094088.X.

* cited by examiner

CURRENT DENSITY : LARGE

ELECTRIC-POWER CONVERSION APPARATUS

CROSS REFERENCE TO RELATED APPLICATIONS

This application is a National Stage of International Application No. PCT/JP2017/031058 filed Aug. 30, 2017.

TECHNICAL FIELD

The present invention relates to an electric-power conversion apparatus in which a resin member seals an electric power semiconductor device in a case.

BACKGROUND ART

In recent years, in the automobile industry, vehicles such as a hybrid automobile and an electric automobile, each of which utilizes a motor as a driving power source, have actively been developed. An inverter for driving the motor utilizes a battery as a power source so as to supply a high-voltage driving electric power to the motor. Moreover, a resin-sealing-type electric power semiconductor apparatus is utilized in the inverter; thus, in the field of power electronics, the importance of an electric-power conversion apparatus, as a key device, is increasing more and more.

The electric power semiconductor device utilized in the inverter and other constituent components are integrally sealed with resin. In such an electric-power conversion apparatus, when while electric power is supplied from the battery, a short-circuit failure occurs in an electronic component such as an electric power semiconductor device or a smoothing capacitor included in a snubber circuit, an excessive short circuit current flows. For example, when due to a malfunction of a gate driving circuit in an inverter control circuit, upper and lower arms of the inverter are short-circuited, an excessive current flows in the power semiconductor device and hence a short-circuit failure occurs.

When in a short-circuit state, connection of a relay for linking the battery with a motor driving circuit or continuation of the connection makes a large current cause the electric-power conversion apparatus to emit smoke and to burn out. In addition, it is conceivable that due to the flow of an excessive current that exceeds the rating, the battery connected with the motor-driving inverter is damaged. In order to prevent these situations, a sensor for detecting an excessive current is generally utilized so that when an excessive current flows, the current is cut off by controlling switching of the electric power semiconductor device at high speed. However, it is desired that even when the electric power semiconductor device fails due to short-circuiting, the foregoing failure modes such as smoke emission and the like are more securely prevented.

Specifically, for example, when an excessive current cutoff fuse is inserted into the electric power semiconductor apparatus and the battery, the excessive current that flows between the motor-driving inverter and the battery can be prevented.

However, a chip-type excessive current cutoff fuse is expensive. Therefore, there is required an excessive current cutoff means that is inexpensive but can securely cut off an excessive current that could flow when the electric power semiconductor device fails due to short-circuiting. For example, in after-mentioned PLT 1, an external-connection electrode protruding from a semiconductor apparatus to the outside is cut so as to reduce the cross-sectional area thereof, so that a fuse portion is formed.

CITATION LIST

Patent Literature

PLT 1: JP2005-175439 A

SUMMARY OF INVENTION

Technical Problem

However, in the technology in PLT 1, the fuse portion provided in the external-connection electrode is exposed to the outside of the semiconductor apparatus. Accordingly, when the fuse portion is melted by an excessive current, smoke may flow out of the apparatus; in addition, sparks may be scattered to the surroundings and hence combustion reaction utilizing the outer air may cause the apparatus to burn out. Moreover, the material of the melted fuse portion may be scattered to the surroundings and hence the external-connection electrode and a peripheral member may be short-circuited. Moreover, because the heat conductivity of gas is low, heat generated in the fuse portion is not radiated to the outer air but is transferred to the semiconductor device, thereby giving damage to the semiconductor device.

Accordingly, there is desired an electric-power conversion apparatus in which smoke emission, a burnout, and short-circuiting between the fuse portion and a peripheral member, caused by a melted material, can be suppressed even when the fuse portion is melted by an excessive current.

Solution to Problem

An electric-power conversion apparatus according to the present invention includes an electric power semiconductor device, an electrode wiring member connected with a main electrode of the electric power semiconductor device, a case, a fuse portion that is formed in the electrode wiring member and functions as a fuse, a fuse resin member that is a resin member disposed between the fuse portion and the case, and a sealing resin member that is a resin member for sealing the electric power semiconductor device, the electrode wiring member, the fuse portion, and the fuse resin member in the case.

Advantage of Invention

In an electric-power conversion apparatus according to the present invention, a fuse portion is formed in an electrode wiring member; thus, because no expensive chip-type fuse is provided, the cost of the fuse portion can be reduced. Because a sealing resin member covers the fuse portion and a fuse resin member, the material of the melted fuse portion is prevented from scattering to the outside. Moreover, because the fuse portion and the fuse resin member can be shut down from the outer air, an arc discharge produced at a time of melting can be suppressed from making a combustion reaction proceed and smoke produced at a time of melting can be suppressed from leaking out to the outside. Arrangement of the fuse resin member between the fuse portion and the case makes it possible that the melted material of the fuse portion is suppressed from making contact with the case and that a short circuit between the electrode wiring member and the case is suppressed from being caused. Moreover, because it is made possible that heat generated in the fuse portion at a time of melting is transferred to the case through the intermediary of the fuse resin member and hence the fuse portion is cooled, the generated heat can be suppressed from giving damage to the electric power semiconductor device, the sealing resin member, and the like. Moreover, because the fuse resin member dedicated to the fuse portion is provided, it is made possible to select a resin member made of a material suitable for melting of the fuse portion; thus, the insulating performance and the cooling performance at a time of melting can be raised. As a result, smoke emission, a burnout, and short-circuiting between the fuse portion and a peripheral member, caused by a melted material, can be suppressed even when the fuse portion is melted by an excessive current.

DESCRIPTION OF EMBODIMENTS

Embodiment 1

Figure 1:
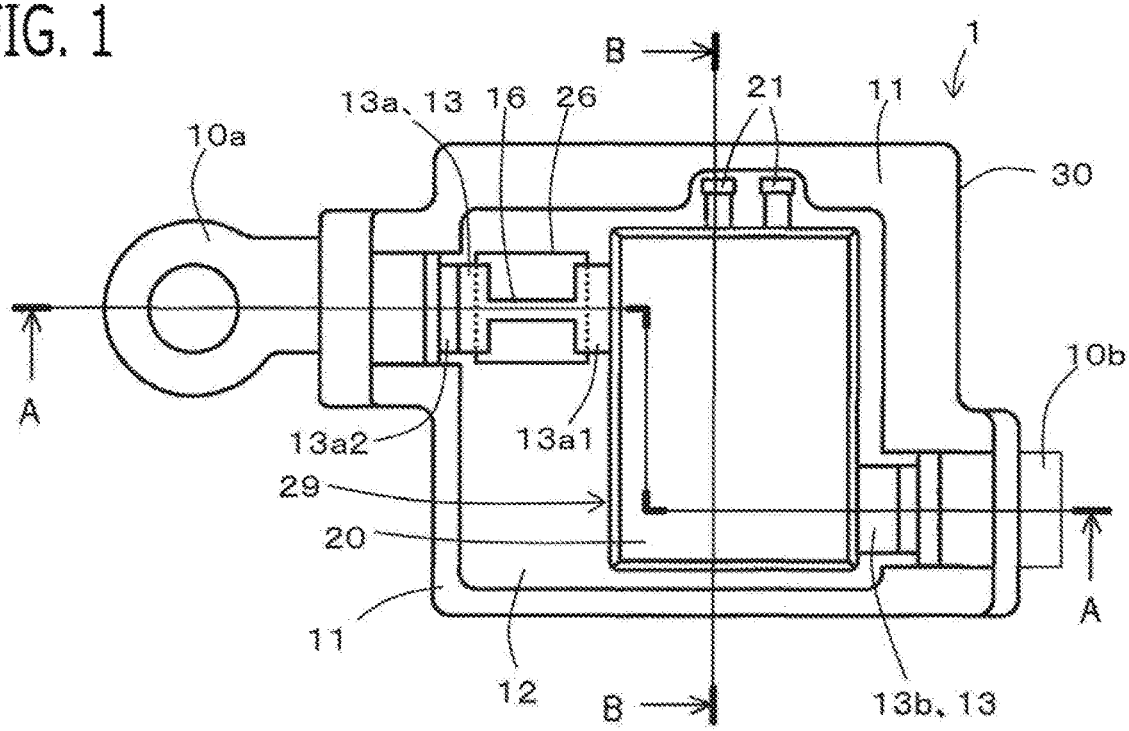
FIG. 1 is a plan view of an electric-power conversion apparatus according to Embodiment 1 of the present invention.
Figure 2:
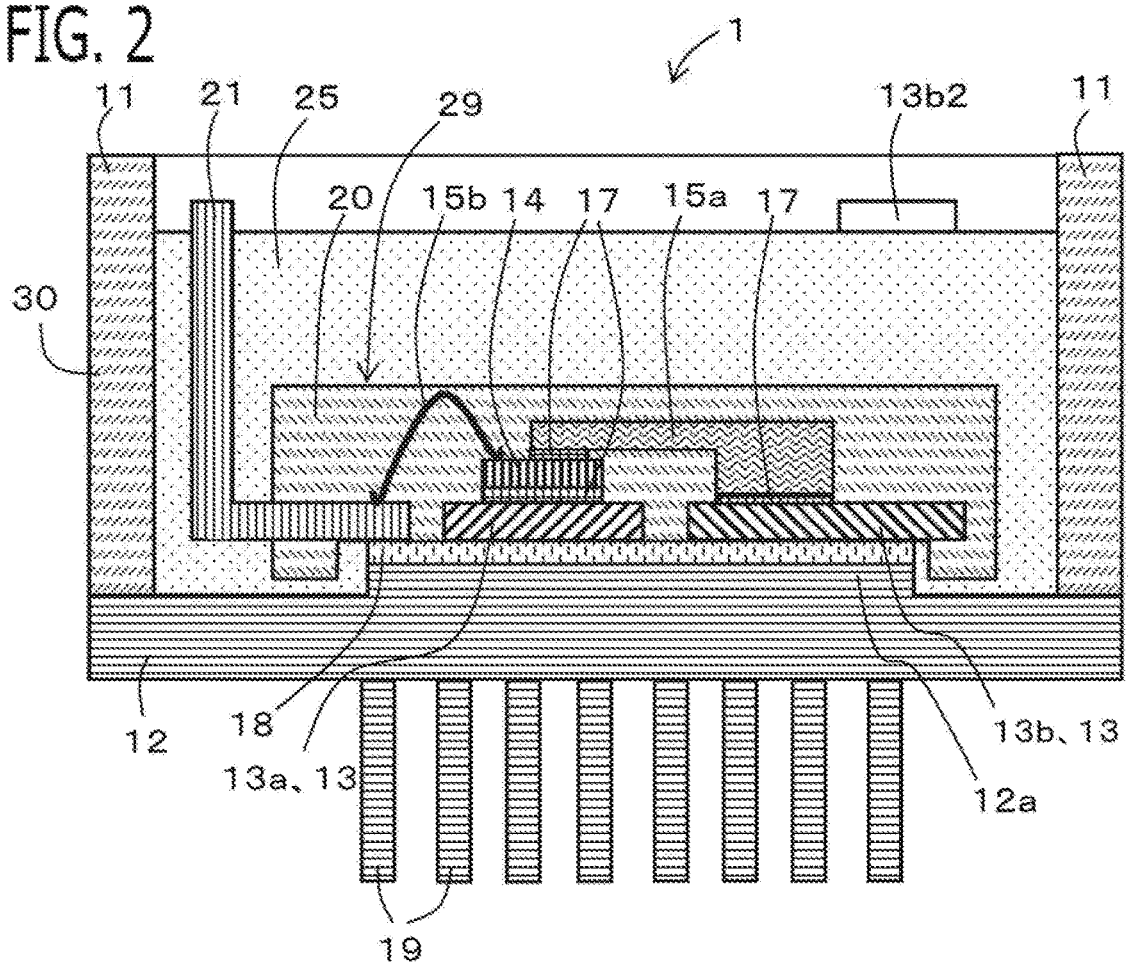
FIG. 2 is a cross-sectional view of the electric-power conversion apparatus according to Embodiment 1 of the present invention, when taken at the B □ B cross-sectional position in FIG. 1.
Figure 3:
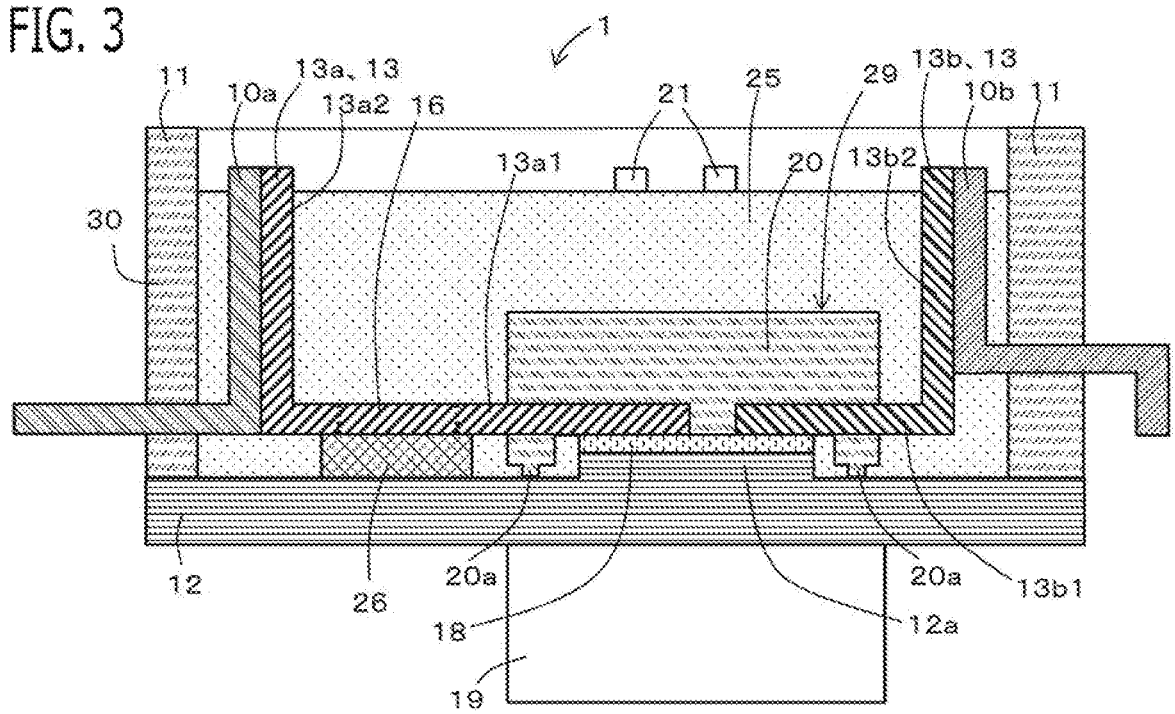
FIG. 3 is a cross-sectional view of the electric-power conversion apparatus according to Embodiment 1 of the present invention, when taken at the A □ A cross-sectional position in FIG. 1.

An electric-power conversion apparatus 1 according to Embodiment 1 will be explained with reference to drawings. FIG. 1 is a plan view of the electric-power conversion apparatus 1, when viewed from the opening side of a case 30; in order to explain the arrangement of respective components, a sealing resin member 25 is made transparent and is not illustrated. FIG. 2 is a cross-sectional view taken at the B-B cross-sectional position in FIG. 1; FIG. 3 is a cross-sectional view taken at the A-A cross-sectional position in FIG. 1. Because each of FIGS. 1, 2, and 3 is a schematic diagram, the respective dimensions of each of the members do not perfectly coincide with one another in the drawings.

The electric-power conversion apparatus 1 includes an electric power semiconductor device 14, an electrode wiring member 13 connected with the main electrode of the electric power semiconductor device 14, the case 30, and the sealing resin member 25, which is a resin member that seals the respective components, such as the electric power semiconductor device 14 and the like, in the case 30.

<The Case 30>

The case 30 is formed in the shape of a bottomed tube and plays a role as a frame for casting the sealing resin member 25 into a mold. It is assumed that in the case where "in" and "inside" or "out" and "outside" are simply referred to, hereinafter, they each mean the inside or the outside of the case 30. It is assumed that "longitudinal direction" means the direction in which the tubular portion of the case 30 is extended and that "transverse direction" means the direction in which the bottom portion of the case 30 is extended.

The bottom portion of the case 30 is formed of a metal heat sink 12. The heat sink 12 has a role of radiating heat generated in the electric power semiconductor device 14 to the outside. For the heat sink 12, for example, a material such as aluminum, an aluminum alloy, or the like having a thermal conductivity of 20 W/(m·K) or higher is utilized. The heat sink 12 is formed in the shape of a rectangular flat plate. A device-facing protruding portion 12a protruding toward the inside and having a flat-plate shape is provided in the inner surface portion, of the heat sink 12, that faces members at the side of the electric power semiconductor device 14; the inner surface of the device-facing protruding portion 12a abuts on the members at the side of the electric power semiconductor device 14. As illustrated in FIG. 2, two or more flat-plate fins 19, which are arranged spaced a gap apart from one another, are provided on the outer surface of the heat sink 12. The fin 19 is in contact with the outer air; the heat sink 12 radiates heat from the fin 19 toward the outer air. It may be allowed that a water cooling type is utilized.

The tubular portion of the case 30 is formed of an insulating case 11. The insulating case 11 is formed by use of an arbitrary resin material having a high insulating property and a high thermoplasticity, for example, a polybutylene terephthalate (PBT), a polyphenylene sulfide (PPS), a polyetheretherketone (PEEK), or the like.

<The Electric Power Semiconductor Device 14, the Electrode Wiring Member 13>

In the present embodiment, the electric power semiconductor device 14 and electrode lead frames 13 as the electrode wiring members 13, are sealed with a device molding resin 20, which is a resin member; as a result, a packaged semiconductor-device module 29 is obtained. A control lead frame 21 connected with a control terminal of the electric power semiconductor device 14 is also sealed with the device molding resin 20. The electrode lead frames 13 and the control lead frame 21 protrude from the device molding resin 20 to the outside. It is desirable that as the device molding resin 20, a hard resin having a Young's modulus of several GPa is utilized so that the inner device and wirings are protected; for example, an epoxy resin is utilized.

As the electric power semiconductor device 14, a power MOSFET (Metal Oxide Semiconductor Field Effect Transistor) is utilized. It may be allowed that as the electric power semiconductor device 14, another kind of switching device, such as a power IGBT (Insulated Gate Bipolar Transistor) with which a diode is connected in an antiparallel manner, is utilized. The electric power semiconductor device 14 is a device that is utilized in an inverter circuit or a converter circuit for driving an apparatus such as a vehicle driving motor and that controls a rated current of several amperes to several hundreds of amperes. It may be allowed that as the material of the electric power semiconductor device 14, silicone (Si), a silicon carbide (SiC), a gallium nitride (GaN), or the like is utilized.

The electric power semiconductor device 14 is formed in the shape of a rectangular-flat-plate chip; the drain terminal, as a main electrode, is provided in the surface thereof at the side of the heat sink 12, and the source terminal, as a main electrode, is provided in the surface thereof at the side opposite to the side of the heat sink 12 of the case 30. In addition, the gate terminal, as a control terminal, is provided in the surface thereof at the side opposite to the side of the heat sink 12 of the case 30. It may be allowed that as the control terminal, a sensor terminal or the like for detecting a current flowing between the main electrodes is provided.

The drain terminal is connected with a positive-polarity electrode lead frame 13a; the source terminal is connected with a negative-polarity electrode lead frame 13b through the intermediary of an electrode wiring member 15a. Because a large current flows therethrough, the electrode wiring member 15a is formed of, for example, a member obtained by processing a plate material of gold, silver, copper, or aluminum; alternatively, the electrode wiring member 15a is formed through wire bonding or ribbon bonding. Each of the gate terminal and the sensor terminal is connected with the control lead frame 21 through the intermediary of a control wiring member 15b. The control wiring member 15b can be formed, for example, through wire bonding with gold, copper, aluminum or the like or through ribbon bonding with aluminum.

Each of the positive-polarity electrode lead frame 13a and the negative-polarity electrode lead frame 13b is formed in the shape of a flat plate. The respective electrode connection portions, of the electrode lead frames 13a and 13b, that are connected with the main electrodes of the electric power semiconductor device 14 are arranged at the side that is closer to the heat sink 12 than to the electric power semiconductor device 14. The surface, at the side opposite to the side of the heat sink 12, of the electrode connection portion of the positive-polarity electrode lead frame 13a is bonded with a conductive bonding material 17 to the drain terminal on the surface, at the side of the heat sink 12, of the electric power semiconductor device 14. The surface, at the side opposite to the side of the heat sink 12, of the electrode connection portion of the negative-polarity electrode lead frame 13b is bonded with the conductive bonding material 17 to one end of the electrode wiring member 15a, which is formed in an L-shaped manner. The source terminal on the surface, at the side opposite to the side of the heat sink 12, of the electric power semiconductor device 14 is bonded with the conductive bonding material 17 to the other end of the electrode wiring member 15a. The conductive bonding material 17 is formed of, for example, a high-conductivity and high-thermal-conductivity material such as solder, silver paste, a conductive adhesive, or the like.

The surface, at the side of the heat sink 12, of the electrode connection portion of each of the electrode lead frames 13a and 13b is not covered with the device molding resin 20 but is exposed to the outside of the semiconductor-device module 29. Each of the exposed portions of the electrode lead frames 13a and 13b is in contact with the inner surface of the device-facing protruding portion 12a of the heat sink 12, through the intermediary of insulating member 18, which is formed in the shape of a sheet. Heat generated in the electric power semiconductor device 14 is transferred to the heat sink 12, through the intermediary of the respective electrode connection portions of the electrode lead frames 13a and 13b and the insulating member 18. The insulating member 18 is formed of a material having a high thermal conductivity and a high electric insulation property. Thus, the insulating member 18 is formed of, for example, grease, an insulation sheet, or an adhesive made of a resin material such as a silicone resin, an epoxy resin, or an urethane resin that has an insulating property and a heat conductivity of several W/(m·K) to several tens of W/(m·K). Moreover, the insulating member 18 can be formed by combining a resin material with another material, such as a ceramic substrate or a metal substrate, that has a high thermal resistance and a high insulating property.

In order to restrict the thickness of the insulating member 18, a protrusion 20a is provided in the device molding resin 20 at the side of the heat sink 12. By pressing the protrusion 20a of the device molding resin 20 against the heat sink 12, the thickness of the insulating member 18 can be restricted by the height of the protrusion 20a; therefore, the insulating property and the heat-conductive property of the insulating member 18 can be managed. For example, in the case of a low-withstanding-pressure automobile utilizing a 12-Volt battery, the creepage distance required for securing a predetermined withstand voltage is substantially 10 µm. Accordingly, in the case of a low-withstanding-pressure automobile, the thickness required for insulation can be decreased; thus, the protrusion 20a of the device molding resin 20 can be shortened and hence the thickness of the electric-power conversion apparatus 1 can be reduced. In the case where the insulating member 18 is made of a material that has a rigidity and whose thickness is changed little by pressing force, the thickness of the insulating member 18 can be managed; thus, the protrusion 20a of the device molding resin 20 is not required.

The gap between the heat sink 12 and the electrode lead frames 13a and 13b sealed with the device molding resin 20 can be managed by the protrusions 20a, and hence the thickness of a fuse resin member 26 disposed between the heat sink 12 and an after-mentioned fuse portion 16 formed in the positive-polarity electrode lead frame 13a can be managed; therefore, the thermal conductivity and the insulating property therebetween can be managed.

After protruding from the device molding resin 20, the positive-polarity electrode lead frame 13a extends in the transverse direction along the inner surface of the heat sink 12 in such a manner as to be spaced a gap apart from the inner surface of the heat sink 12; after that, the positive-polarity electrode lead frame 13a bends, and then extends in the longitudinal direction toward the side departing from the heat sink 12 (toward the side of the opening of the case 30). The portion extending in the transverse direction in such a manner as to be spaced a gap apart from the inner surface of the heat sink 12 will be referred to as a positive-polarity transverse-direction extending portion 13a1; the portion extending in the longitudinal direction toward the side departing from the heat sink 12 will be referred to as a positive-polarity longitudinal-direction extending portion 13a2. The distance between the positive-polarity transverse-direction extending portion 13a1 and the heat sink 12 corresponds to the distance obtained by adding the thickness of the insulating member 18 and the height of the device-facing protruding portion 12a of the heat sink 12. The fuse portion 16, described later, is formed in the positive-polarity transverse-direction extending portion 13a1.

Through welding, soldering, or the like, the positive-polarity longitudinal-direction extending portion 13a2 is bonded to the positive-polarity external connection terminal 10a inserted into and outserted to the insulating case 11. The positive-polarity external connection terminal 10a has a portion that extends in the longitudinal direction and is bonded to the positive-polarity longitudinal-direction extending portion 13a2 and a portion that extends in the transverse direction toward the outside of the case 30. The portion protruding from the case 30 to the outside is connected with other apparatuses such as the positive electrode of a DC power source and the like.

Similarly, the negative-polarity electrode lead frame 13b has a negative-polarity transverse-direction extending portion 13b1, which protrudes from the device molding resin 20 and then extends along the inner surface of the heat sink 12 in such a way as to be spaced a gap apart from the inner surface of the heat sink 12, and a negative-polarity longitudinal-direction extending portion 13b2, which extends toward the side departing from the heat sink 12. In order to form the fuse portion 16, the length of the positive-polarity transverse-direction extending portion 13a1 is larger than that of the negative-polarity transverse-direction extending portion 13b1.

Through welding, soldering, or the like, the negative-polarity longitudinal-direction extending portion 13b2 is bonded to the negative-polarity external connection terminal 10b inserted into and outserted to the insulating case 11. The negative-polarity external connection terminal 10b has a portion that extends in the longitudinal direction and is bonded to the negative-polarity longitudinal-direction extending portion 13b2 and a portion that extends in the transverse direction toward the outside of the case 30. The portion protruding from the case 30 to the outside is connected with other apparatuses such as the negative electrode of the DC power source and the like.

As each of the electrode lead frames 13a and 13b and the external connection terminals 10a and 10b, a high-conductivity and high-thermal-conductivity metal such as copper, a copper alloy, or the like is utilized; a large current as large as several amperes to several hundreds of amperes flows therein. It may be allowed that each of the surfaces of the electrode lead frames 13a and 13b is plated with a metal material such as Au, Ni, or Sn.

The control lead frame 21 protrudes from the sealing resin member 25 toward the opening of the case 30 and is connected with a control apparatus for performing on/off-control of the electric power semiconductor device 14.

<The Fuse Portion 16>

The fuse portion 16, which functions as a fuse, is formed in the electrode wiring member 13. In the present embodiment, the fuse portion 16 is formed in a portion (the positive-polarity transverse-direction extending portion 13a1, in this example), of the electrode lead frame 13, that protrudes from the device molding resin 20 toward the outside. Because the fuse portion 16 is formed in the electrode lead frame 13, no additional member is required and hence the cost thereof can be reduced. In this example, because the fuse portion 16 is formed in the transverse-direction extending portion of the electrode lead frame 13, it can be suppressed that due to the formation of the fuse portion 16, the electrode lead frame 13 becomes long in the direction departing from the heat sink 12 (in the longitudinal direction), and hence the height of the electric-power conversion apparatus 1 is suppressed from becoming large. Moreover, because the fuse portion 16 is formed in the positive-polarity electrode lead frame 13a, a current can be cut off at the upstream side of the electric power semiconductor device 14. Accordingly, even when a circuit abnormality in the electric power semiconductor device 14, such as a short circuit between the electric power semiconductor device 14 and the case 30, occurs, it is made possible that the current is cut off at the upstream side thereof and hence no excessive current is caused.

Figure 4:
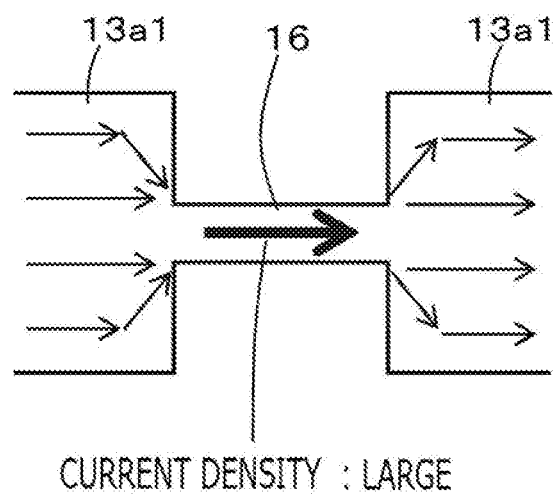
FIG. 4 is a schematic diagram for explaining a current density in a fuse portion according to Embodiment 1 of the present invention.
Figure 5A:
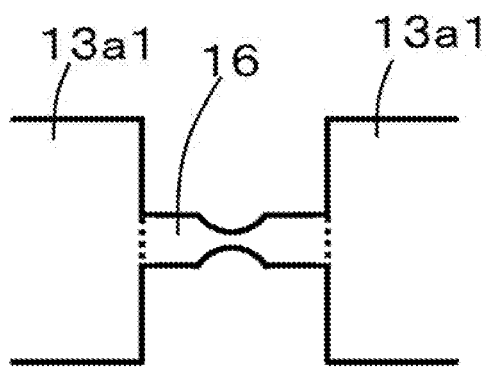
FIG. 5A, FIG. 5B, FIG. 5C, FIG. 5D are schematic views for explaining variation in the shape of the fuse portion according to Embodiment 1 of the present invention.
Figure 5B:
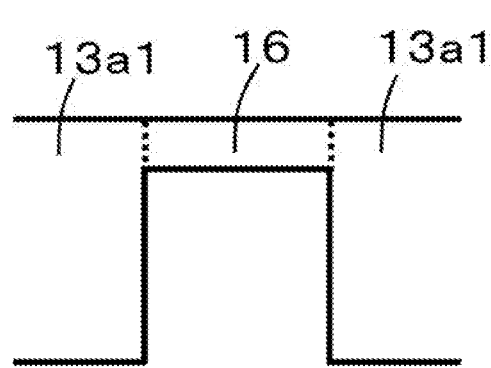
Figure 5C:
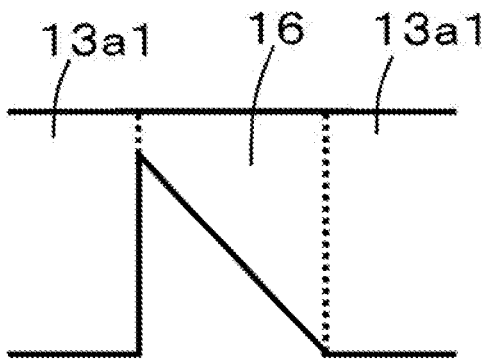
Figure 5D:
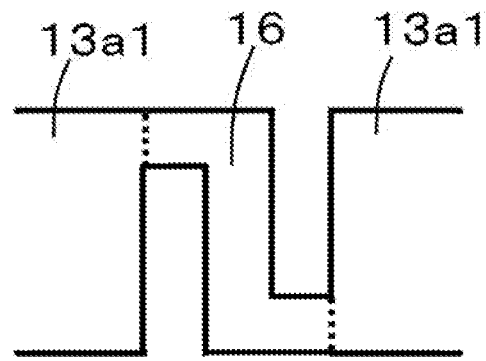
Figure 6A:
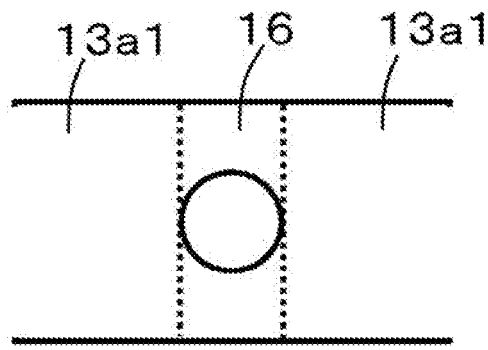
FIG. 6A, FIG. 6B, FIG. 6C, FIG. 6D, FIG. 6E are schematic views for explaining variation in the shape of the fuse portion according to Embodiment 1 of the present invention.
Figure 6B:
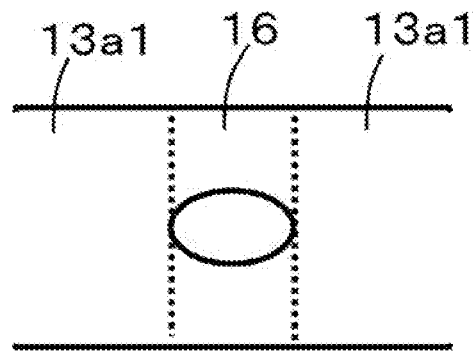
Figure 6C:
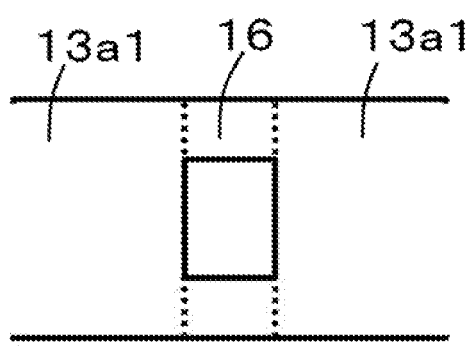
Figure 6D:
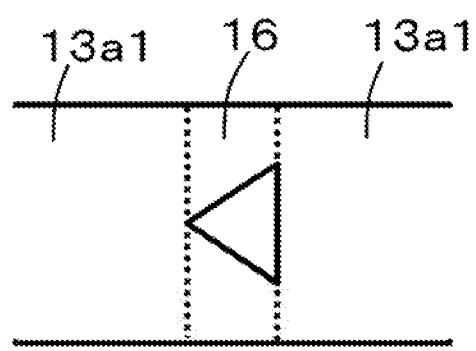
Figure 6E:
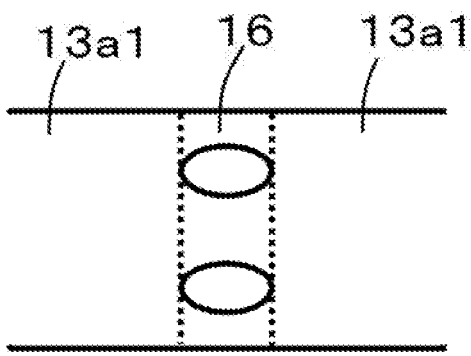

The fuse portion 16 is formed of a portion, of the electrode wiring member 13, that has a cross-sectional area smaller than that of each of the portions at the before and after positions thereof in the flowing direction of a current. That is to say, the cross-sectional area of the fuse portion 16 is smaller than that of each of the portions at the before (upstream) and after (downstream) sides of the fuse portion 16 in the current-lowing direction. As illustrated in FIG. 4, when an excessive current flows in the electrode lead frame 13, the current density in the fuse portion 16 having a cross-sectional area smaller than that of each of the portions at the before and after positions thereof becomes large, and hence the temperature of the fuse portion 16 locally rises and the fuse portion 16 melts; thus, the excessive current is cut off. The fuse portion 16 is formed of gold, silver, copper, or aluminum that has a high electrical conductivity. As the fuse portion 16, a material either the same as or different from that of the other portion of the electrode lead frame 13 may be utilized. Although not limited to this, as is the case with the other portion of the electrode lead frame 13, the fuse portion 16 can be formed by punching a copper or copper-alloy flat plate having a thickness of substantially 0.5 mm to 1.5 mm.

The shape of the fuse portion 16 may be arbitrary as long as the shape decreases the cross-sectional area thereof. For example, it may be allowed that as illustrated in each of FIG. 5A to FIG. 5D and FIG. 6A to FIG. 6E, the cross-sectional area is reduced by providing a notch at one side thereof or a notch at each of the both sides thereof or by providing a through-hole therein. The shape of the notch or the through-hole may be not only a rectangle but also an arbitrary shape such as a triangle, a pentagon, a trapezoid, a rhombus, a parallelogram, a circle, or an ellipse. It may be allowed that not only a single but also two or more notches or through-holes are provided. Moreover, it may be allowed that two or more notches or through-holes are arranged at different positions in the longitudinal direction of the wiring in such a way as to be alternate in a zig-zag manner or in such a way as to be at random. Two or more through-holes may be arranged either in the transverse direction of the wiring or in the longitudinal direction thereof.

<The Fuse Resin Member 26>

The fuse resin member 26, which is a resin member, is disposed between the fuse portion 16 and the case 30 (the heat sink 12, in this example). As illustrated in each of FIGS. 1 and 3, the fuse resin member 26 is disposed in an area wider than that of the fuse portion 16, when viewed in the longitudinal direction. In other words, when viewed in the longitudinal direction, the disposition region of the fuse resin member 26 covers the formation region of the fuse portion 16. The fuse resin member 26 makes contact not only with the surface, at the side of the heat sink 12, of the fuse portion 16 but also with the surface, at the side of the fuse portion, of the heat sink 12.

Before the sealing resin member 25 is filled into the case 30, the fuse resin member 26 is disposed between the fuse portion 16 and the case 30. The fuse resin member 26 is formed of grease, an insulation sheet, or an adhesive made of a resin material such as a silicone resin, an epoxy resin, or an urethane resin that has a high electric insulation property. Moreover, the fuse resin member 26 can be formed by combining another material such as a ceramic substrate or a metal substrate, which has a high thermal resistance and a high insulating property, with the foregoing resin material.

The material of the fuse resin member 26 may be a material having a high thermal conductivity of, for example, 1 W/(m·K) to several tens W/(m·K), as long as it is a material having a high electric insulation property.

Provision of the fuse resin member 26 between the fuse portion 16 and the case 30 makes it possible that the melted material of the fuse portion 16 is suppressed from making contact with the heat sink 12 and that a short circuit between the electrode wiring member 13 and the heat sink 12 is suppressed from being caused. Moreover, because it is made possible that heat generated in the fuse portion 16 at a time of melting is transferred to the heat sink 12 through the intermediary of the fuse resin member 26 and hence the fuse portion 16 is cooled, the generated heat can be suppressed from giving damage to the electric power semiconductor device 14, the sealing resin member 25, and the like. Moreover, because the fuse resin member 26 dedicated to the fuse portion 16 is provided, it is made possible to select a resin member made of a material suitable for melting of the fuse portion 16; thus, the insulating performance and the cooling performance at a time of melting can be raised.

In the present embodiment, as the fuse resin member 26, a resin member having a Young's modulus lower than that of the sealing resin member 25 is utilized. For example, it is desirable that the Young's modulus of the fuse resin member 26 is in the order of several tens of MPa (megapascals) (e.g., a value between 10 MPa and 30 MPa) and that for example, a rubber material, a silicone rubber, or a silicone gel is utilized. This configuration make it possible that when the fuse portion 16 melts, the melting material that scatters in the form of a plurality of sphere-shaped particles is embedded in the fuse resin member 26, which has a Young's modulus lower than that of the sealing resin member 25 and is soft, so as to be held in such a way as to be dispersed in the fuse resin member 26. Therefore, it is made possible that after melting, the melted material is prevented from maintaining the energization path and hence the energization path is quickly cut off. Moreover, the melted material is prevented from breaking the sealing resin member 25 having a high Young's modulus.

It is desirable that as the fuse resin member 26, there is utilized a silicone resin that has an arc-extinguishing action for an arc discharge that is produced when the fuse portion 16 melts. This configuration makes it possible that an ark discharge is suppressed from continuing energization even after the fuse portion has melted and hence the current is quickly cut off after the melting. Accordingly, damage to the electric power semiconductor device 14, the sealing resin member 25, and the like can be suppressed.

<The Sealing Resin Member 25>

The sealing resin member 25 is a resin member for sealing the electric power semiconductor device 14, the electrode wiring member 13, the fuse portion 16, and the fuse resin member 26 in the case 30. In the present embodiment, the sealing resin member 25 is configured in such a way as to seal the semiconductor-device module 29 in the case 30. The sealing resin member 25 also seals other constituent components such as the insulating member 18 and the external connection terminals 10a and 10b in the case 30. As the sealing resin member 25, for example, a resin material having a high rigidity and a high heat conductivity is utilized. It may be allowed that the sealing resin member 25 is formed of, for example, an epoxy resin, a silicone resin, a urethane resin, PPS, PEEK, or ABS that contains heat transfer fillers. It is desirable that the Young's modulus of the sealing resin member 25 is a value between 1 MPa and 50 GPa and that the heat conductivity thereof is a value between 0.1 W/(m·K) and 20 W/(m·K). The sealing resin member 25 seals the respective constituent components so that the vibration resistance and the environment resistance can be raised.

Because the sealing resin member 25 covers the fuse portion 16 and the fuse resin member 26, the material of the melted fuse portion 16 is prevented from scattering to the outside. Because the fuse portion 16 and the fuse resin member 26 can be shut down from the outer air, an arc discharge produced at a time of melting can be suppressed from making a combustion reaction proceed and smoke produced at a time of melting can be suppressed from leaking out to the outside.

Embodiment 2

Figure 7:
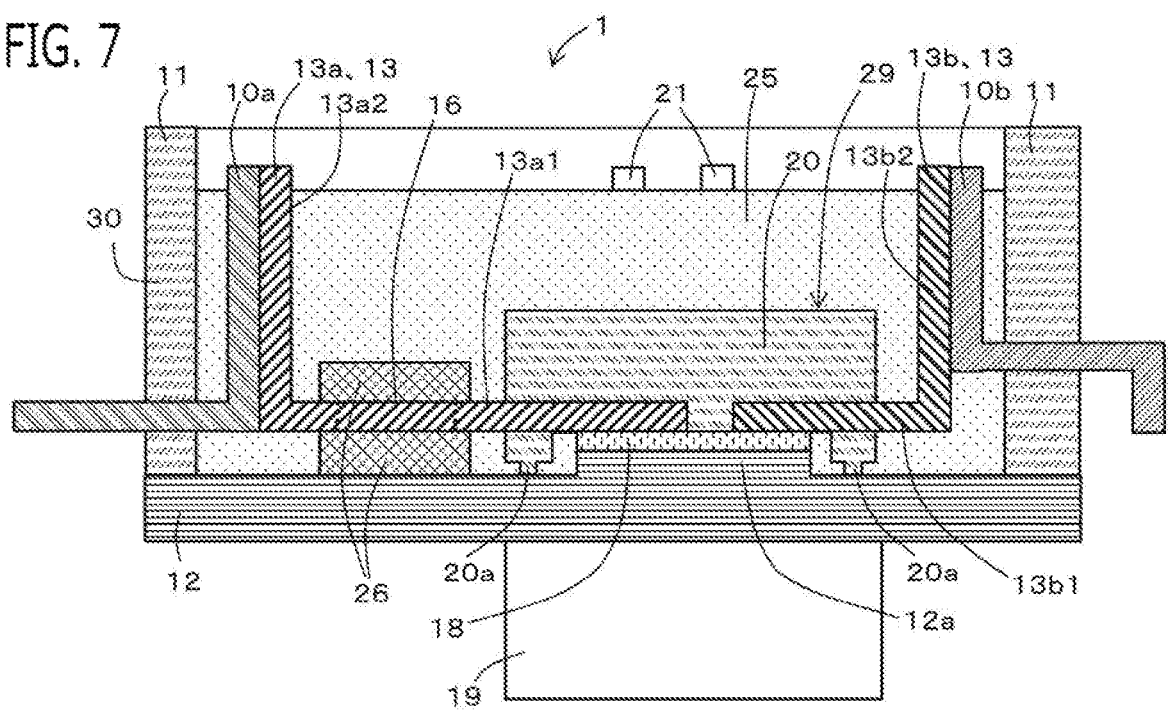
FIG. 7 is a cross-sectional view of an electric-power conversion apparatus according to Embodiment 2 of the present invention, when taken at the A □ A cross-sectional position in FIG. 1.

Next, an electric-power conversion apparatus 1 according to Embodiment 2 will be explained. The explanation for constituent portions that are the same as those in foregoing Embodiment 1 will be omitted. The basic configuration of the electric-power conversion apparatus 1 according to the present embodiment is similar to that of Embodiment 1; however, part of the configuration of a fuse resin member 26 is different. FIG. 7 is a cross-sectional view of the electric-power conversion apparatus 1 according to the present embodiment, when taken at the A-A cross-sectional position in FIG. 1.

As is the case with Embodiment 1, the fuse resin member 26 is disposed between the fuse portion 16 and the case 30 (the heat sink 12, in this example). Unlike Embodiment 1, the fuse resin member 26 is disposed also on the fuse portion 16 at the side opposite to the side of the case 30 (the heat sink 12). That is to say, the respective fuse resin members 26 are disposed at the both sides of the fuse portion 16, i.e., at the side of the case 30 and at the side opposite to the side of the case 30. The side opposite to the side of the case 30 is the side departing from the heat sink 12, i.e., at the side of the opening of the case 30. This configuration makes it possible that the material of the melted fuse portion 16 is suppressed from making contact with the sealing resin member 25 and giving damage to the sealing resin member 25.

Moreover, in the case where as the fuse resin member 26, a resin member having a Young's modulus lower than that of the sealing resin member 25 is utilized, the melted material can be held in the soft fuse resin member 26 also at the side opposite to the side of the case 30; thus, it is made possible that the energization path is securely cut off and that the melted material is securely suppressed from breaking the sealing resin member 25 having a high Young's modulus.

Moreover, when in the case where as the fuse resin member 26, a silicone resin having an arc-extinguishing action is utilized, the fuse resin member 26 is disposed also at the side opposite to the side of the case 30, the arc-extinguishing action for an arc discharge can further be raised; thus, after melting, the current can more quickly be cut off.

In the present embodiment, the fuse resin members 26 are arranged also at the both sides of the fuse portion 16; thus, fuse resin members 26 are arranged in such a way as to cover the whole circumference of the fuse portion 16. This configuration makes it possible to further raise the suppression action of the fuse resin member 26 for damage to the sealing resin member 25, the certainty in cutting the energization path, the arc-extinguishing action, and the like.

Embodiment 3

Figure 8:
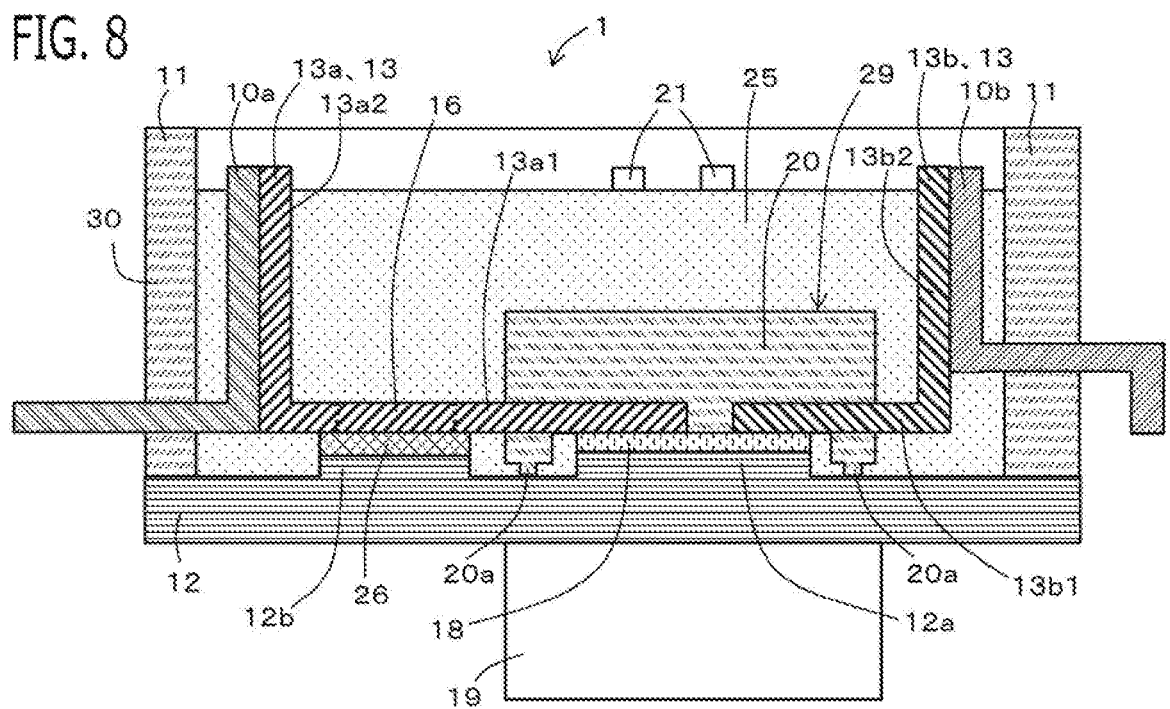
FIG. 8 is a cross-sectional view of an electric-power conversion apparatus according to Embodiment 3 of the present invention, when taken at the A □ A cross-sectional position in FIG. 1.

Next, an electric-power conversion apparatus 1 according to Embodiment 3 will be explained. The explanation for constituent portions that are the same as those in foregoing Embodiment 1 will be omitted. The basic configuration of the electric-power conversion apparatus 1 according to the present embodiment is similar to that of Embodiment 1; however, part of each of the configurations of a heat sink 12 and a fuse resin member 26 is different. FIG. 8 is a cross-sectional view of the electric-power conversion apparatus 1 according to the present embodiment, when taken at the A-A cross-sectional position in FIG. 1.

As is the case with Embodiment 1, the fuse resin member 26 is disposed between the fuse portion 16 and the case 30 (the heat sink 12, in this example). However, unlike Embodiment 1, a fuse-facing protruding portion 12*b*, which is a protruding portion that protrudes toward the side of the fuse portion 16 (toward the inside), is provided in an inner-surface portion, of the case 30 (the heat sink 12, in this example), that faces the fuse portion 16. The fuse-facing protruding portion 12*b* is formed in the shape of a flat plate. When viewed in the longitudinal direction, the fuse-facing protruding portion 12*b* is formed in an area as large as that of the arrangement area of the fuse resin member 26. Accordingly, the distance between the heat sink 12 and the fuse portion 16 on which the fuse resin member 26 is disposed is decreased by the dimension corresponding to the protruding height of the fuse-facing protruding portion 12*b*. Thus, because the thickness of the fuse resin member 26 can be reduced, it is made possible that heat transfer from the fuse portion 16 to the heat sink 12 through the intermediary of the fuse resin member 26 is further raised and hence the suppression action for damage to the electric power semiconductor device 14, the sealing resin member 25, and the like to be caused by heat generated at a time of melting is further raised. Moreover, a balance between the thermal conductivity and the insulating property can be achieved by adjusting the protruding height of the fuse-facing protruding portion 12*b*.

As is the case with Embodiment 3, it may be allowed that the fuse resin members 26 is disposed also on a portion, of the fuse portion 16, that is at the side opposite to the side of the case 30 (the heat sink 12) or that the fuse resin members 26 is arranged in such a way as to cover the whole circumference of the fuse portion 16.

Other Embodiments

Lastly, other embodiments of the present invention will be explained. Each of the configurations of embodiments to be explained below is not limited to be separately utilized but can be utilized in combination with the configurations of other embodiments as long as no discrepancy occurs.

(1) In each of the foregoing embodiments, there has been explained, as an example, the case where the electric power semiconductor device 14 and electrode lead frames 13, as the electrode wiring members 13, are sealed with the device molding resin 20, which is a resin member, so that the semiconductor-device module 29 is obtained. However, embodiments of the present invention are not limited to the foregoing case. In other words, it is not required that the electric power semiconductor device 14 and the electrode wiring member 13 are sealed with the device molding resin 20 so that the semiconductor-device module 29 is packaged. That is to say, it may be allowed that the electric power semiconductor device 14, the electrode wiring member 13, and the like that are not sealed with the device molding resin 20 are sealed, in the case 30, with the sealing resin member 25. In this case, it may be allowed that the electrode wiring member 13 is a bus bar or the like and that the fuse portion 16 is formed in a portion of any one of the positive-polarity electrode wiring member and the negative-polarity electrode wiring member that are sealed with the sealing resin member 25.

(2) In each of the foregoing embodiments, there has been explained, as an example, the case where the fuse portion 16 is formed in the positive-polarity electrode lead frame 13*a* (the transverse-direction extending portion 13*a*1). However, embodiments of the present invention are not limited to the foregoing case. In other words, it may be allowed that the fuse portion 16 is formed in an arbitrary portion, as long as it is a portion of the electrode wiring member 13 that is connected with the main electrode of the electric power semiconductor device 14 and is sealed with the sealing resin member 25. For example, it may be allowed that the fuse portion 16 is formed in the transverse-direction extending portion 13*b*1 of the negative-polarity electrode lead frame 13*b*, the positive-polarity longitudinal-direction extending portion 13*a*2, the negative-polarity longitudinal-direction extending portion 13*b*2, or any one of the positive-polarity external connection terminal 10*a* and the negative-polarity external connection terminal 10*b*.

(3) In each of the foregoing embodiments, there has been explained, as an example, the case where the electric-power conversion apparatus 1 is provided with a single electric power semiconductor device 14 (switching device). However, embodiments of the present invention are not limited to the foregoing case. That is to say, it may be allowed that the electric-power conversion apparatus 1 is provided with two or more electric power semiconductor devices. For example, it may be allowed that between a positive-polarity electrode wiring member and a negative-polarity electrode wiring member, two switching devices are connected in series with each other and the fuse portion 16 is formed in the positive-polarity or negative-polarity electrode wiring member. In addition, it may be allowed that between a positive-polarity electrode wiring member and a negative-polarity electrode wiring member, there is disposed a bridge circuit in which two or more sets of series circuits, each of which includes two switching devices, are connected in parallel with one another and that the fuse portion 16 is formed in the electrode wiring member for each of the two or more sets of series circuits. It may be allowed that all of or part of the electric power semiconductor devices 14 are diodes.

In the scope of the present invention, the embodiments thereof can freely be combined with one another and can appropriately be modified or omitted.

REFERENCE SIGNS LIST

1: electric-power conversion apparatus
12*b*: fuse-facing protruding portion
13: electrode wiring member
14: electric power semiconductor device
16: fuse portion
20: device molding resin
25: sealing resin member
26: fuse resin member
29: semiconductor-device module
30: case

The invention claimed is:

1. An electric-power conversion apparatus comprising:
an electric power semiconductor device;
an electrode wiring member connected with a main electrode of the electric power semiconductor device;
a case;

a fuse portion that is formed in the electrode wiring member and functions as a fuse;

a fuse resin member that is a resin member disposed between the fuse portion and the case; and a sealing resin member that is a resin member for sealing the electric power semiconductor device, the electrode wiring member, the fuse portion, and the fuse resin member in the case, wherein the case is provided with a metal heat sink, wherein the fuse portion extends along the heat sink in such a manner as to be spaced a gap apart from the heat sink, and wherein the fuse resin member is disposed between the fuse portion and the heat sink, and is in contact with the fuse portion and the heat sink.

2. The electric-power conversion apparatus according to claim 1, wherein the electric power semiconductor device and electrode lead frames, as the electrode wiring members, are sealed with a device molding resin that is a resin member, so that a semiconductor-device module is obtained, and wherein the fuse portion is formed in a portion of the electrode lead frame protruding from the device molding resin to the outside.

3. The electric-power conversion apparatus according to claim 1, wherein the fuse resin member is disposed also on a portion, of the fuse portion, that is at a side of the fuse portion opposite to a side of the fuse portion facing the case.

4. The electric-power conversion apparatus according to claim 1, wherein the fuse resin member is disposed in such a way as to cover a whole circumference of the fuse portion.

5. The electric-power conversion apparatus according to claim 1, wherein the fuse resin member has a Young's modulus lower than that of the sealing resin member.

6. The electric-power conversion apparatus according to claim 1, wherein a Young's modulus of the fuse resin member is in the order of several tens of megapascals.

7. The electric-power conversion apparatus according to claim 1, wherein as the fuse resin member, there is utilized a silicone resin that has an arc-extinguishing action for an arc discharge that is produced when the fuse portion melts.

8. The electric-power conversion apparatus according to claim 1, wherein the case is formed in a shape of a bottomed tube whose bottom portion includes metal heat sink, and wherein the fuse resin member is disposed between the fuse portion and the heat sink.

9. An electric-power conversion apparatus comprising:

an electric power semiconductor device;

an electrode wiring member connected with a main electrode of the electric power semiconductor device;

a case;

a fuse portion that is formed in the electrode wiring member and functions as a fuse;

a fuse resin member that is a resin member disposed between the fuse portion and the case; and a sealing resin member that is a resin member for sealing the electric power semiconductor device, the electrode wiring member, the fuse portion, and the fuse resin member in the case, wherein the case is provided with a metal heat sink, wherein the fuse portion is formed of a portion, of the electrode wiring member, that has a cross-sectional area smaller than that of each of the portions at before and after positions thereof in the flowing direction of a current, and wherein the fuse resin member is in contact with the fuse portion and the heat sink.

10. An electric-power conversion apparatus comprising:

an electric power semiconductor device;

an electrode wiring member connected with a main electrode an of the electric power semiconductor device;

a case;

a fuse portion that is formed in the electrode wiring member and functions as a fuse;

a fuse resin member that is a resin member disposed between the fuse portion and the case; and a sealing resin member that is a resin member for sealing the electric power semiconductor device, the electrode wiring member, the fuse portion, and the fuse resin member in the case, wherein an inner surface of the case comprises a fuse-facing protruding portion that contacts the fuse resin member and protrudes toward a side of the fuse portion facing the case.

* * * * *